United States Patent
Feierabend et al.

(10) Patent No.: US 7,057,245 B2
(45) Date of Patent: Jun. 6, 2006

(54) METHOD AND APPARATUS FOR ASSEMBLING AN ARRAY OF MICRO-DEVICES

(75) Inventors: Patrick Edward Feierabend, Santa Barbara, CA (US); Richard Thomas Martin, Goleta, CA (US); Jeffery Frank Summers, Santa Barbara, CA (US); Andrew Dexter Wallis, Los Alamos, CA (US); Paul J. Rubel, Santa Barbara, CA (US); John Stuart Foster, Santa Barbara, CA (US); John W Stocker, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 34 days.

(21) Appl. No.: 10/866,123

(22) Filed: Jun. 12, 2004

(65) Prior Publication Data

US 2005/0003631 A1    Jan. 6, 2005

Related U.S. Application Data

(62) Division of application No. 09/764,913, filed on Jan. 17, 2001, now Pat. No. 6,812,061.

(51) Int. Cl.
*H01L 27/14* (2006.01)
*H01L 29/82* (2006.01)
*H01L 29/84* (2006.01)

(52) U.S. Cl. .................................................... 257/414
(58) Field of Classification Search ................ 257/414
See application file for complete search history.

(56) References Cited

U.S. PATENT DOCUMENTS

| | | | |
|---|---|---|---|
| 5,979,728 A | 11/1999 | Alfaro | |
| 6,321,654 B1* | 11/2001 | Robinson | 102/251 |
| 6,401,545 B1* | 6/2002 | Monk et al. | 73/756 |
| 6,410,360 B1* | 6/2002 | Steenberge | 438/52 |
| 6,448,109 B1 | 9/2002 | Karpman | |
| 6,452,238 B1 | 9/2002 | Orcutt et al. | |
| 6,521,477 B1 | 2/2003 | Gooch et al. | |
| 2002/0081816 A1 | 6/2002 | Spooner et al. | |
| 2002/0096743 A1 | 7/2002 | Spooner et al. | |
| 2002/0132389 A1* | 9/2002 | Patel et al. | 438/97 |
| 2003/0054588 A1* | 3/2003 | Patel et al. | 438/107 |

* cited by examiner

Primary Examiner—W. David Coleman
Assistant Examiner—Nicholas J. Tobergte
(74) Attorney, Agent, or Firm—Jaquelin K. Spong

(57) ABSTRACT

The invention describes a method and apparatus for deploying micromachined actuators in a plane which is orthogonal to the original fabrication plane of the devices. Using batch-processing, photolithographic procedures known in the micromachined electro-mechanical system (MEMS) art, a plurality of devices is constructed on a suitable substrate. The devices are then separated one from another by sawing and dicing the original fabrication wafer. The devices are rotated into an orthogonal orientation and affixed to a second wafer. The second wafer also contains circuitry for addressing and manipulating each of the devices independently of the others. With this method and apparatus, arrays of actuators are constructed whose plane of actuation is perpendicular to the plane of the array. This invention is useful for constructing N×M fiber optic switches, which direct light from N input fibers into M output fibers.

16 Claims, 15 Drawing Sheets

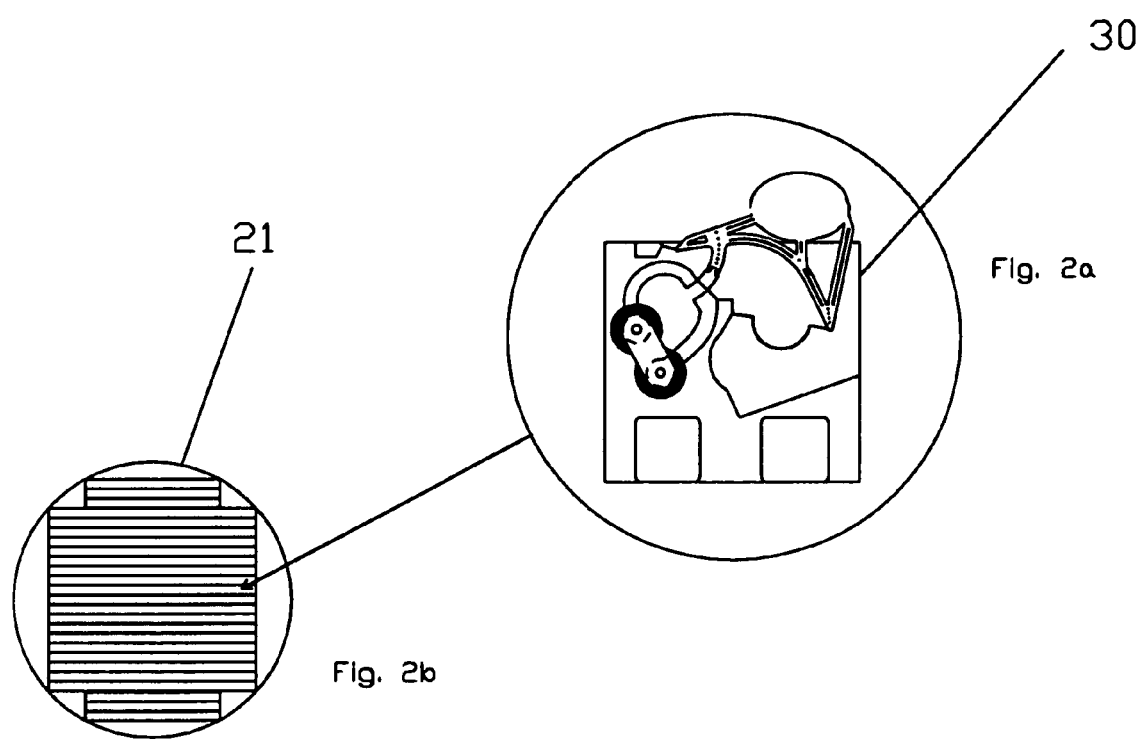

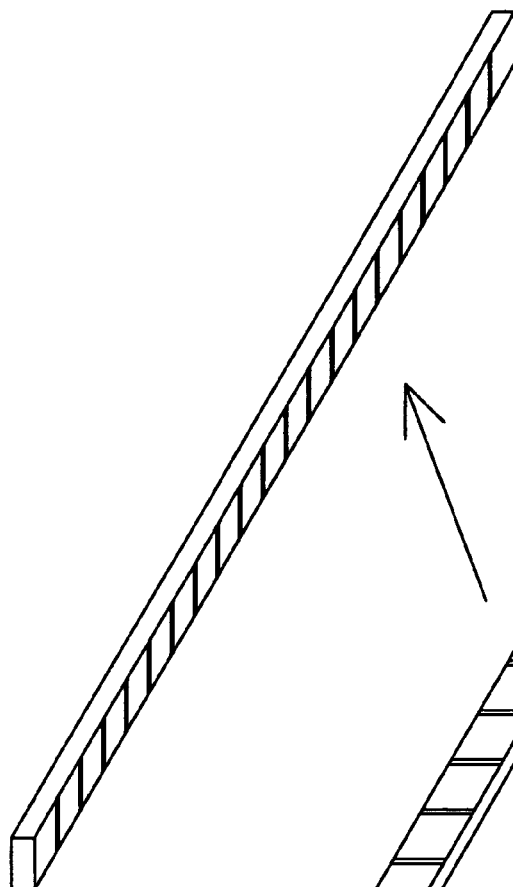
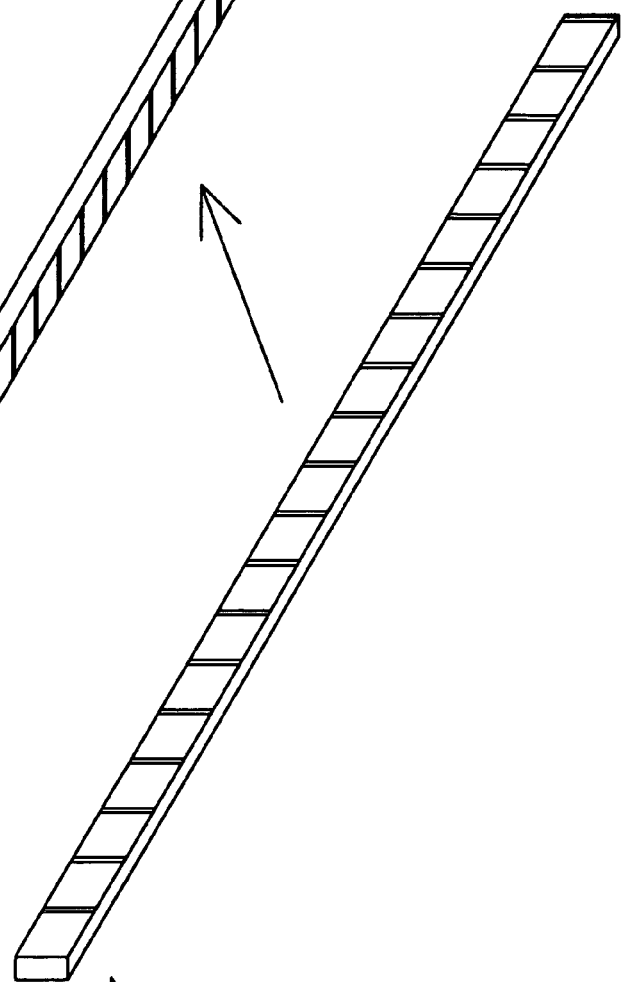
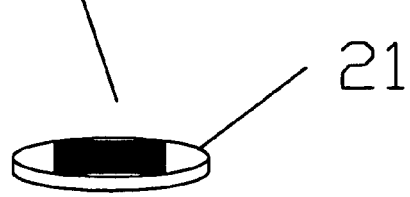
Fig. 2e
Fig. 2d
Fig. 2c
21

METHOD AND APPARATUS FOR ASSEMBLING AN ARRAY OF MICRO-DEVICES

CROSS REFERENCE TO RELATED APPLICATIONS

This U.S. patent application is a divisional application of U.S. application Ser. No. 09/764,913, filed Jan. 17, 2001 now U.S. Pat. No. 6,812,061.

STATEMENT REGARDING FEDERALLY SPONSORED RESEARCH AND DEVELOPMENT

Not applicable.

REFERENCE TO MICROFICHE APPENDIX

Not applicable.

FIELD OF THE INVENTION

This invention relates to micromachined electromechanical systems (MEMS), and their use in switching technology for optical telecommunications.

BACKGROUND OF THE INVENTION

Arrays of high speed, high precision actuation devices are becoming required for a proliferating number of applications, in diverse fields. Deep space astronomical observatories may use multifaceted mirrors, each facet independently controlled by a precision actuator. Digital projection cameras manipulate a plurality of reflectors, in order to cast an image onto a projection screen.

But optical telecommunications in particular, have an urgent need for high bandwidth, low inertia, microactuated reflectors. This industry uses optical wavelength radiation in communication channels, spanning long distances via optical fiber. The fiber generally carries single mode light, but with a bandwidth such that multiple frequencies can be transmitted by a single fiber strand. Called dense wavelength divisional multiplexing (DWDM), each of the multiple frequencies carries a single channel on a specific frequency within the fiber bandwidth.

A major technical challenge for optical telecommunications is switching the optical beams from a set of input fibers to a set of output fibers. Presently, this switching is achieved by converting the optical signal into an electrical signal, switching the signal electronically to the output circuit, and then converting the electrical signal back into modulated light that is inserted into an output fiber. This procedure has many disadvantages, including high cost, complexity, large footprint, and is relatively difficult to upgrade as bandwidths and frequencies change with time.

It is desirable therefore, to accomplish this switching without converting the light into electrical signals. An array of optical switches would address this application, wherein each optical switch (a micromirror) would redirect light from one of N input optical fibers into one of M output fibers. N×M array of such switches would constitute an all-optical N×M fabric for a telecommunications fiber network.

For such high speed, high precision applications, stringent design criteria are set on the physical and mechanical properties of the actuator. It should have low inertia and low power requirements. For low cost applications, it should also be mechanically simple. These considerations have led to the miniaturization of familiar electromechanical devices, using photolithographic processing rather than machining bulk components. Formation of sub-millimeter scale electromechanical systems is now well known in the art, as micromachined electromechanical systems, or MEMS.

Micromachined solenoidal magnetic actuators are known in the MEMS art as micro-solenoid switches. Typically, a slug of magnetic material is affixed to a piston or plunger, and a coil is provided whose diameter is sufficient to admit the slug into its interior. The coil is then energized to repel or attract the slug, depending on the direction of current in the coil. The resulting linear mechanical motion is used to actuate various linear devices, such as opening and closing a switch or valve, or driving a piston. An embodiment of a linear, solenoidal micro-actuator is found for example, in Guckel, et al., U.S. Pat. No. 5,644,177 (1997), "Micromechanical magnetically actuated devices."

Another design option is a rotary actuator. This device resembles a miniaturized electromagnetic motor, with a ferromagnetic core material deposited on the substrate and wound with an electrical coil. The core is patterned with some arrangement of gaps, into each of which protrudes a driven member which interacts magnetostatically with the flux across the gap. A plurality of such elements, when driven in the proper sequence and timing, can produce a positive torque on a freely rotating member. Magnetostatic micromotors can be used as rotary actuators by mounting the device of interest onto the moving member, i.e. the rotor. This concept is clearly described in Mehregany, et al. in U.S. Pat. No. 6,029,337 (2000), "Methods of fabricating micromotors with utilitarian features."

However each of these MEMS devices suffer from a common drawback, which is that the actuation motion is constrained by design and fabrication considerations, to be in the fabrication plane of the device. For example with solenoidal electromagnetic actuator, such as described in the aforementioned prior art, motion of the magnetic slug is required to be in the fabrication plane of the device. For the rotary micromotor, the device is mounted on the rotor, and so rotates in the plane of fabrication of the motor.

Many applications require motion in the orthogonal plane, i.e. vertical to the original plane of fabrication of the MEMS device, and an array of such devices is needed. Examples of such applications include ailerons composed of a multitude of fluid flow diverters, actuated or pivoting in the vertical direction relative to the array. N×M optical switches require an array of independently addressable shutters or reflectors, in which the plane of actuation of the individual devices is orthogonal to the plane of the array, in order to intercept the beams of light passing over the horizon of the array. Projection cameras and multi-faceted reflectors require a tilting motion of the individual mirrors.

Therefore the MEMS fabrication substrate, cannot serve as the array plane for these applications, because the plane of actuation would be parallel to, not perpendicular to, the plane of the array.

Additional beams, gears and bearings can translate actuator motion out-of-plane, as in Ho et al., in U.S. Pat. No. 5,629,918 (1997), "Electromagnetically actuated micromachined flap." In this invention a flap, which is the moving member of the actuator, is coupled by one or more beams to a substrate and thereby cantilevered out of the plan of the substrate. While conceptually this invention allows larger motions in out-of-plane directions, the need for multiple beams and pivots seriously complicates the design and fabrication of the device, and deleteriously affects tolerances and rigidity.

Therefore, an assembly of MEMS actuation devices, operating as an array, and with the plane of motion of each device being substantially perpendicular to the plane of the array, is not heretofore known in the art. Accordingly, there is a distinctly felt need for such an assembly of MEMS devices in a wide variety of applications, and in particular, within the optical telecommunications industry.

BRIEF SUMMARY OF THE INVENTION

The invention described herein is an assembly method and apparatus used to mount a plurality of MEMS devices into an array. Each MEMS device is a low inertia, high bandwidth microactuator carrying the device of interest (shutter, piston, optical element, etc.). In the embodiment described here, each MEMS actuator carries an optical micromirror on the actuator arm. A plurality of like devices is fabricated on a silicon substrate, using processes known in the MEMS art.

Each of the devices is separated into individual dies after fabrication, by sawing the wafer into rows, and sawing the rows into individual dies. The dies are then individually mounted and adjusted on another substrate using an apparatus equipped with vertical and azimuthal actuation means. This second carrier wafer serves as a miniature optical table for the dies.

To achieve the desired plane of motion, the dies are rotated out of their original plane of fabrication, before being affixed to the second carrier wafer. In the preferred embodiment, a 90 degree rotation transforms the original plane of motion into one orthogonal to the plane of the array, as desired. Fine adjustment of the positioning is then accomplished with a feedback mechanism which optimizes the placement before the die is affixed to the second carrier wafer.

The carrier wafer has previously been photolithographically processed using techniques well known in semiconductor device fabrication, to form the supporting electronic circuitry to address and control each MEMS device. This second wafer, carrying the electronic circuitry, is henceforth termed the "circuit wafer", as to distinguish from the original MEMS fabrication wafer.

As a result, the finished circuit wafer comprises an array of micromechanical reflectors, which each reflector independently addressable by associated circuitry. The array of reflectors in designed for use in the optical telecommunications industry, with each mirror capable of extension and retraction out of the plane of the array. This invention gives rise to the following significant advantages:

1. Ability to assemble switching devices in which the plane of the mirror is in the MEMS fabrication plane (which provides the highest quality, lowest loss mirror), but the mirror is deployed in the transverse plane, to intercept beams of light.
2. Ability to pre-test individual dies or rows and assemble only properly functioning devices ("yielded dies"). This is in contrast to optical switch arrays built on a wafer in which a non-yielding die means an imperfect assembled device. Such arrays consequently have either very demanding yield requirements or must be designed with sufficient duplicity to overcome the yield problems.
3. Ability to assemble optical switches with precise alignment independent of warping of substrate materials, and various other manufacturing defects, using a feedback mechanism during assembly.
4. Ability to use one type of optical switch for a large number of different assemblies for different applications. For example, this includes the ability to assemble N×M switch arrays where N and M are any positive integer, using the same building block die.
5. Ability to assemble more than one type of die into an assembly of dies.
6. Ability to assemble a packaged device that is hermetically sealed, the hermetic seal can be confirmed, and the gas enclosed is such that the cooling of the device inside the package is optimized or the mechanical damping of the device is optimized.

The method and apparatus for constructing this array is the subject of this invention disclosure.

BRIEF DESCRIPTION OF THE DRAWINGS

FIG. 2a depicts a simplified view of an individual MEMS device occupying a single die; FIG. 2b shows the device as residing on its fabrication wafer; FIG. 2c shows the MEMS fabrication wafer in perspective view; FIG. 2d illustrates a single row sawed from the wafer. FIG. 2e shows the wafer rotated 90 degrees from the original plane of fabrication.

REFERENCE NUMERALS IN THE DRAWINGS

Figure 1A:
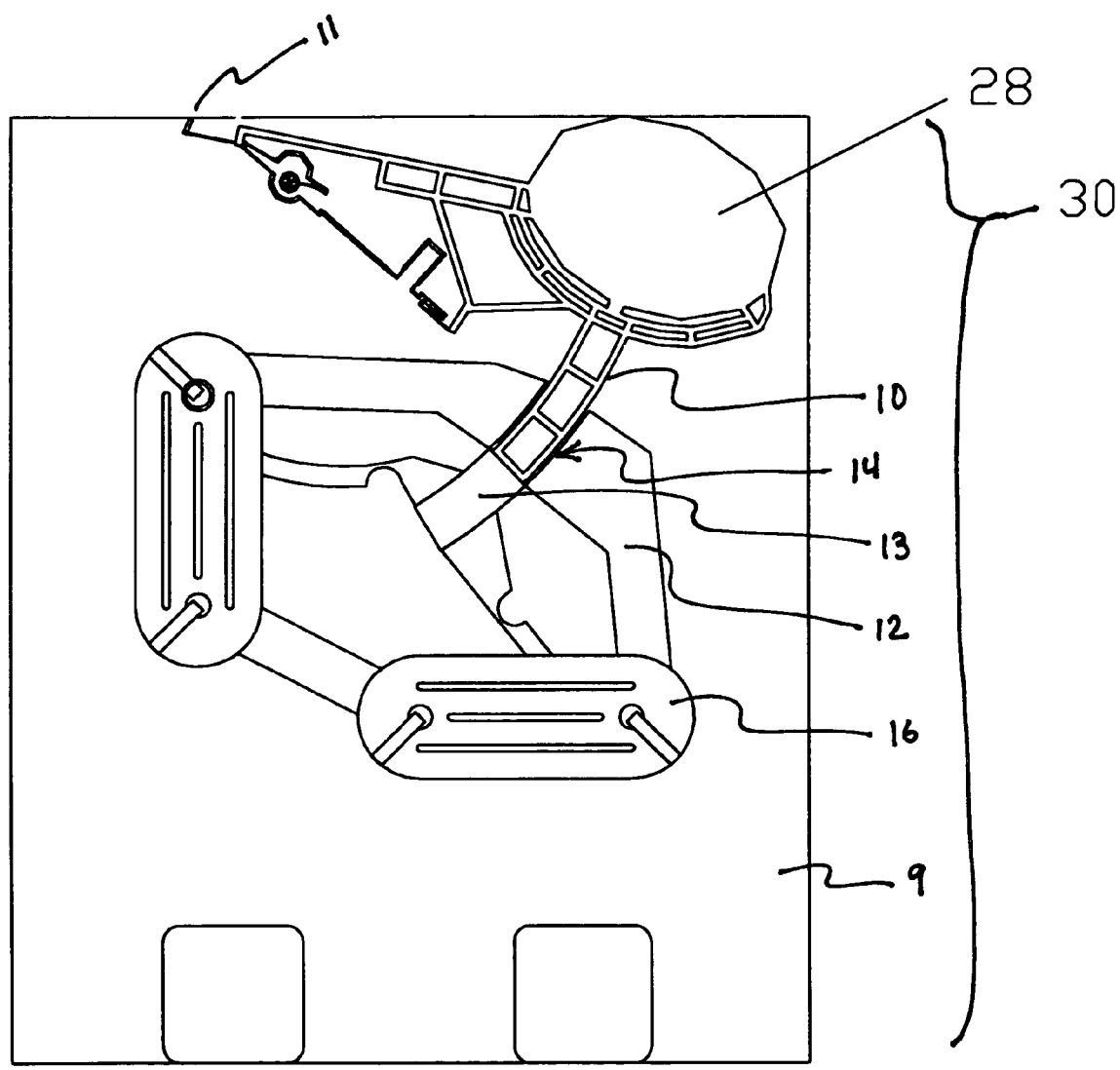
FIG. 1a, b are simplified diagrams of the MEMS actuator in the retracted (a) and extended (b) positions.

9 Substrate
10 Driven member
11 Pivot point
12 Magnetic core
13 Magnetic tab
14 Gap
16 Coil
21 MEMS fabrication wafer
22 circuit wafer
28 mirror
30 die
32 bond pads
34 bond pads
36 conductive trace
40 conductive trace 44 external bonding pads
48 external bond pads
60 solder bump
70 eutectic solder bump
72 mechanical bonding pad
80 plated conducting film
90 die holder
94 vacuum hole
96 die holder cutout
100 elevation actuator
102 azimuth actuator
104 actuator body
106 piezoelectric
110 light source
112 focus lens
120 optical input fiber
122 lens
124 optical fiber
126 lens
128 fiber mounting block
130 fiber mounting block
230 XYZ bench
220 light source
222 light detector
224 amplifier
226 feedback logic
228 computer controller
520 lid
522 eutectic seal
524 gas

DETAILED DESCRIPTION OF THE INVENTION

A unique MEMS actuator is used for the embodiment, because it possesses uniquely large throw and multiple stable positions. Although the design of this low inertia microactuator is not the subject of this invention, it is used for this embodiment because of its advantageous features. As shown diagrammatically in FIGS. 1a and 1b, the actuator comprises a magnetic core 12 with a gap 14 affixed to the substrate 9, and wound with an electrical coil 16, as in a micromotor. Energizing of the coil 16 induces a magnetic flux through the core material, and across the gap 14 in the core. The driven member 10 is a hinge-mounted structure, which pivots about a stationary point 11. The driven member 10 includes a tab of magnetic material 13, which interacts with the core gap field, to impel motion of the member 10 about the pivot point 11. A micromirror 28 is fabricated on the driven member 10 of the low inertia micromechanical actuator die 30. The operational side retains its flat surface and supports the optical coatings.

Figure 1B:
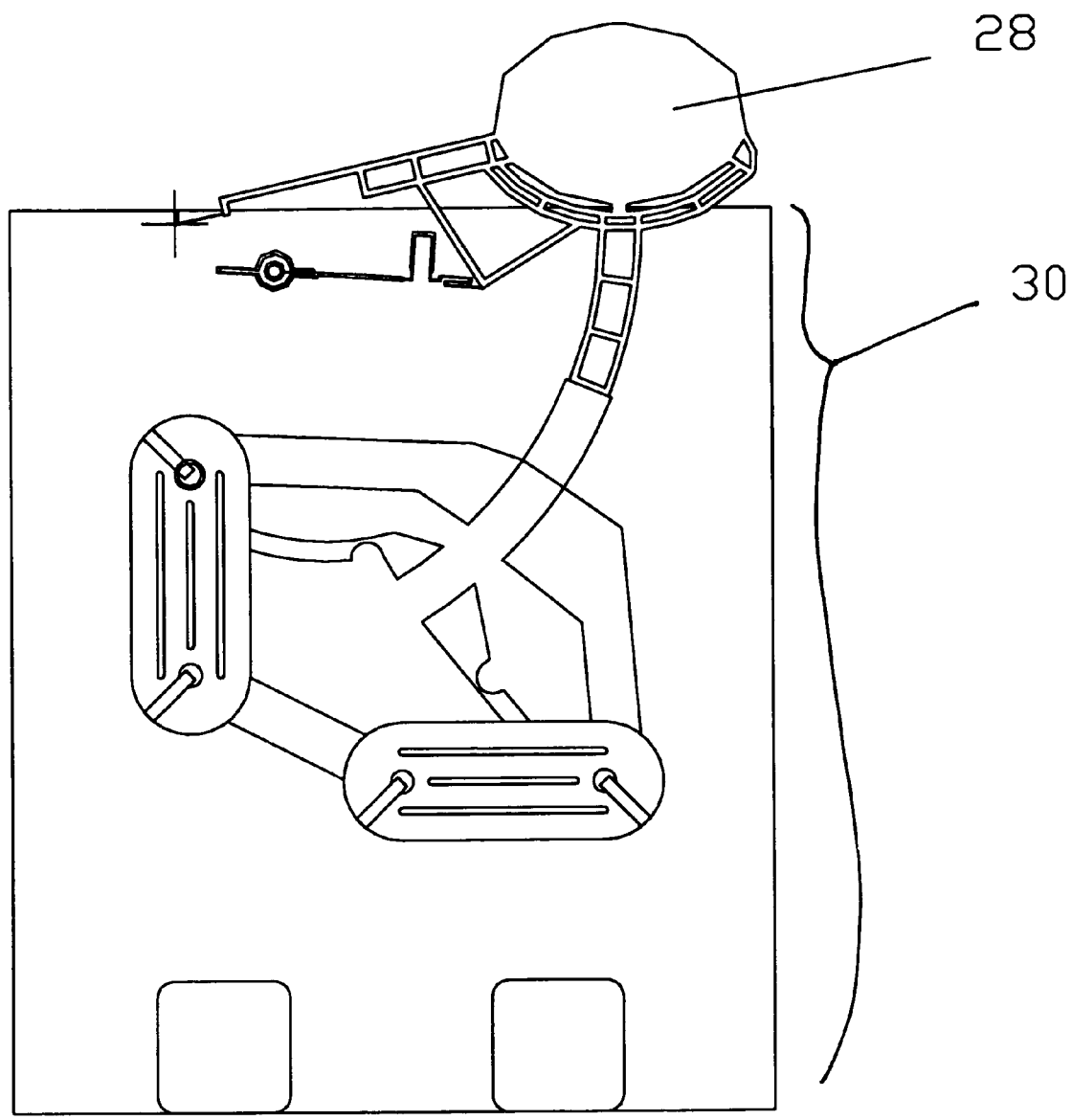

These two constituents, the low inertia microactuator die 30, carrying the micromirror 28, are fabricated on a composite silicon-on-insulator (SOI) substrate. Using batch lithographic processes well known in the MEMS are, a plurality of like devices are constructed on a single SOI substrate. It is desired to separate each individual die, in order to mount them on the circuit wafer which contains the electronic circuitry to drive the individual devices. Further details of the manufacture of the MEMS actuator die 30 shown in FIGS. 1a and 1b are given in U.S. Pat. No. 6,831,380 B2 to Rybnicek, et al, which was incorporated by reference in the parent application, U.S. patent application Ser. No. 09/764,913 filed Jan. 17, 2001, now U.S. Pat. No. 6,812,061 B1. However, since this MEMS actuator is exemplary only, and any other MEMS device may be used to practice this invention, these details are not essential to the understanding of the present invention, they are not set forth herein.

Accordingly, it should be understood that the MEMS actuator die 30 shown in FIGS. 1a and 1b is only one exemplary embodiment, and that many other types of MEMS devices may be used in other exemplary embodiments. For example, the MEMS actuator shown in FIGS. 1a and 1b is shown carrying a micromirror 28. However, it should be understood that the driven member 10 may serve any of a number of alternative purposes. For example, instead of micromirror 28, the driven member 10 may carry an electrical contact, such that the MEMS actuator becomes a MEMS switch, rather than an optical element. In this case, a conducting feature may replace the micromirror 28 shown in FIG. 1a. In yet another embodiment, the MEMS actuator die 30 may be used to restrict flow in a channel, such that MEMS actuator die 30 becomes a fluid flow diverter. As such applications are well known to those of ordinary skill in the art, these alternative features are not shown in FIGS. 1a and 1b. However, it should be understood that the invention described herein is intended to encompass such alternative embodiments.

FIG. 2a shows an individual MEMS device, which forms a single cell in the MEM fabrication wafer of FIG. 2b. The plane of the mirror is in the plane of the MEMS wafer. Rows of these dies are cut from the wafer using a technique well known in the silicon and disk drive recording head industries. These rows can be further cut into individual dies or shorter rows of fewer dies. FIG. 2a shows die 30 that is sliced from MEMS fabrication wafer 21. The rows and/or dies are then rotated 90 degrees and presented to the circuit wafer. The rotation changes the plane of the mirror to be perpendicular to the circuit wafer. These processes are depicted in FIG. 2c–2e.

Figure 3:
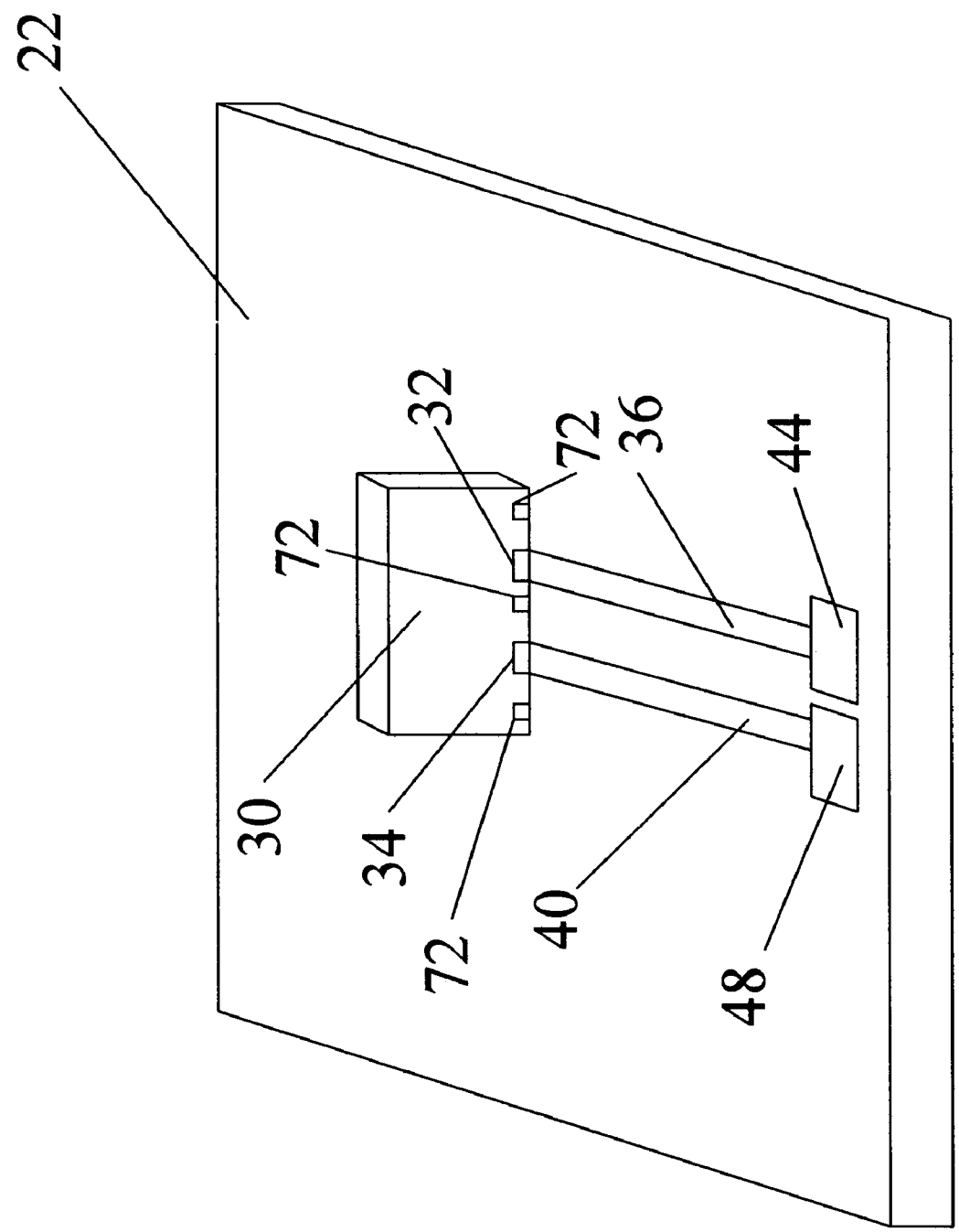
FIG. 3 illustrates an individual die mounted to the circuit substrate.

FIG. 3 shows die 30 mounted to the circuit wafer. Electrically conductive traces 36 and 40 connect bond pads 32 and 34 of die 30 to bond pads 44 and 48. External electrical connection can be made to bond pads 44 and 48 by means well known in the art of packaging electronic devices.

Figure 4:
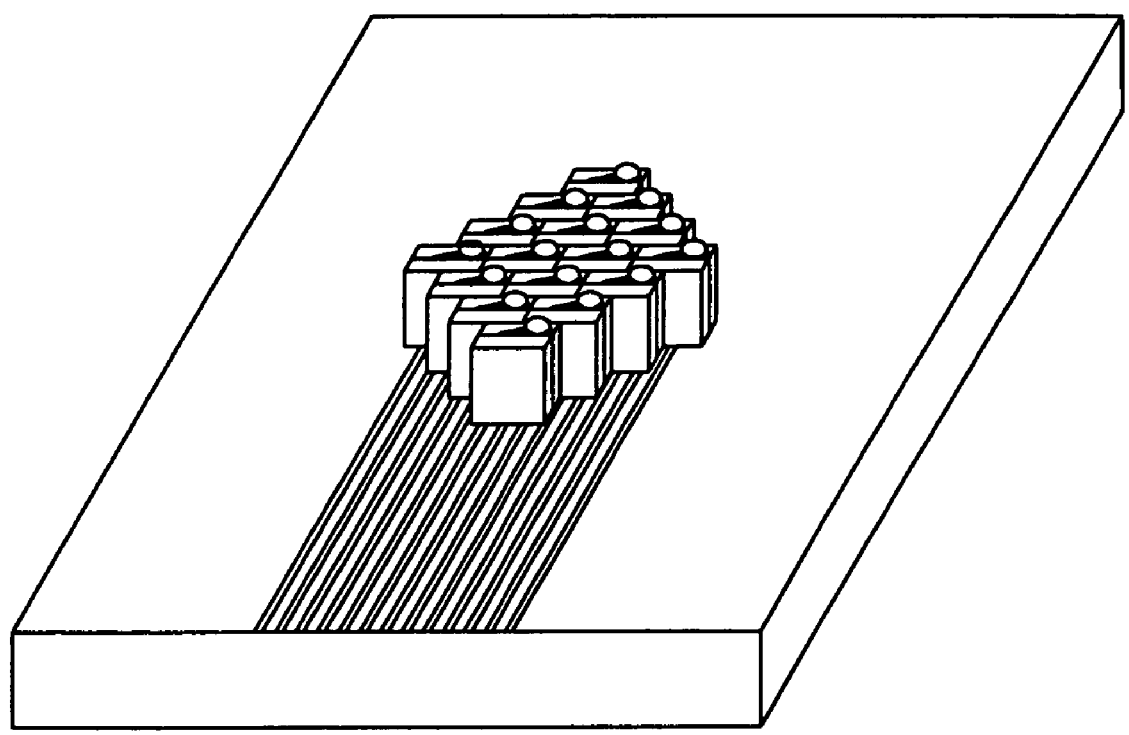
FIG. 4 depicts an array of dies on the circuit substrate.
Figure 5:
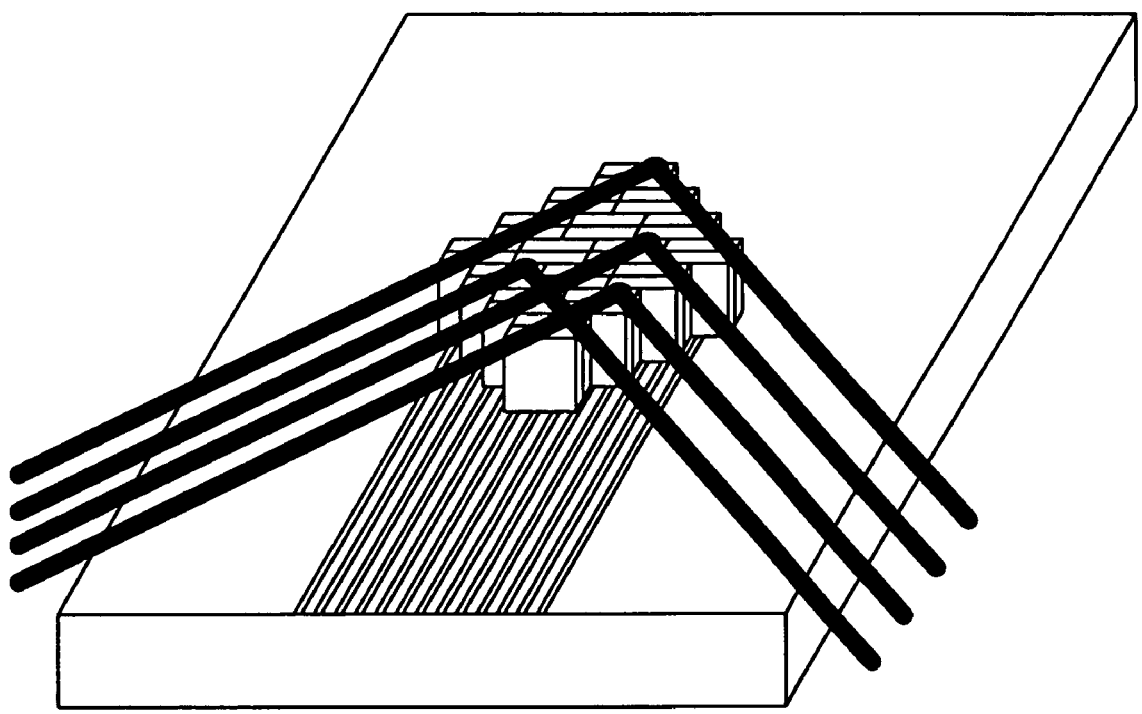
FIG. 5 illustrates the reflection of fight from a number of input fibers to a number of output fibers.

FIG. 4 depicts an array of dies and rows on circuit wafer 22, with an array of electrical connections. FIG. 5 illustrates the way in which light from a number of input fibers can be directed to different output fibers. For each input fiber, a mirror can be raised (put in the extended position) to direct the light to a given output fiber. To redirect the light to a different fiber, that mirror is lowered (put in the retracted position) and the appropriate mirror is put in the up position. Circuit wafer 22 allows the electrical connection to all the actuator/mirror dies.

Figure 6:
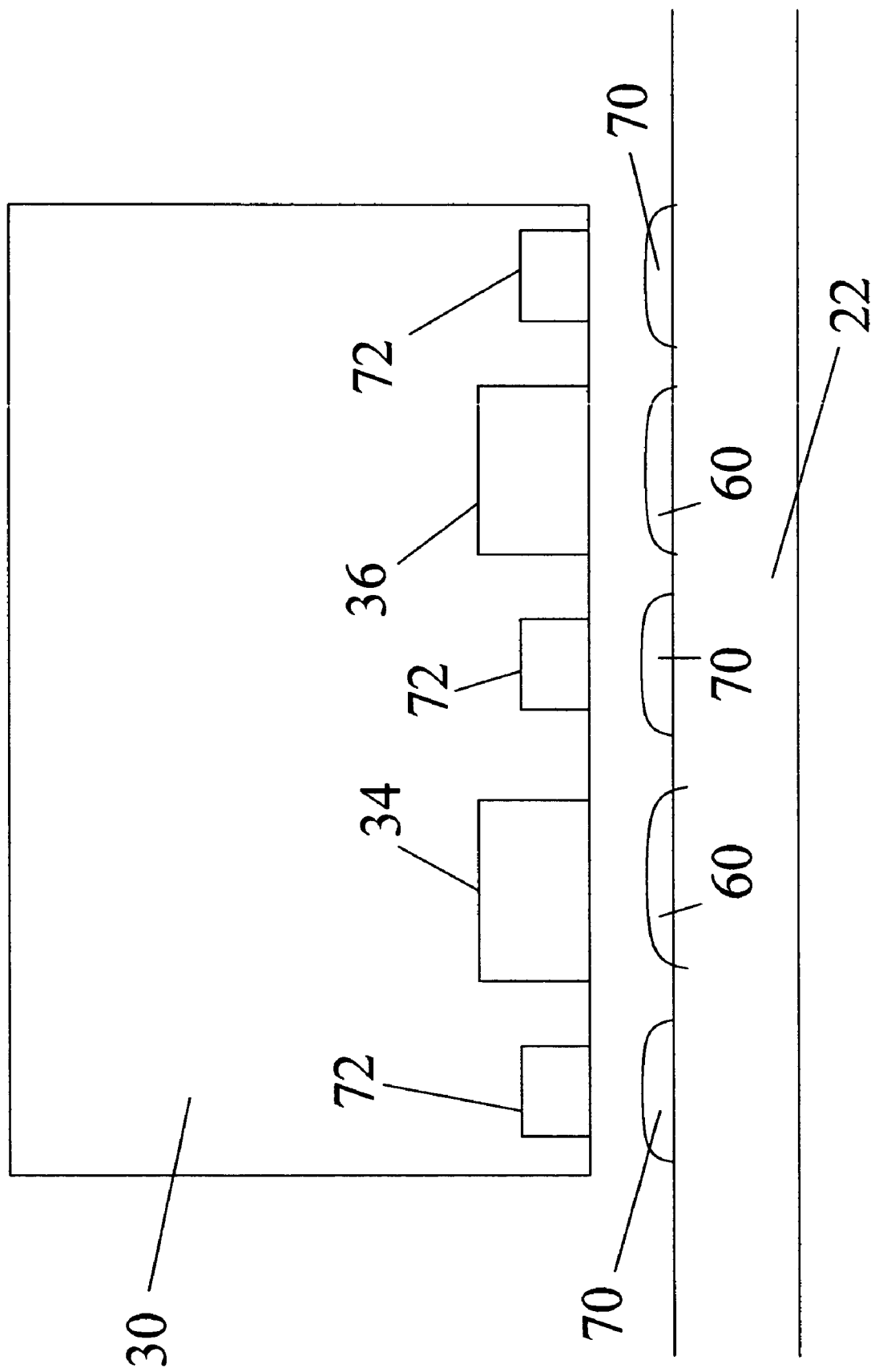
FIG. 6 illustrates the attachment method and apparatus according to the present invention.
Figure 7:
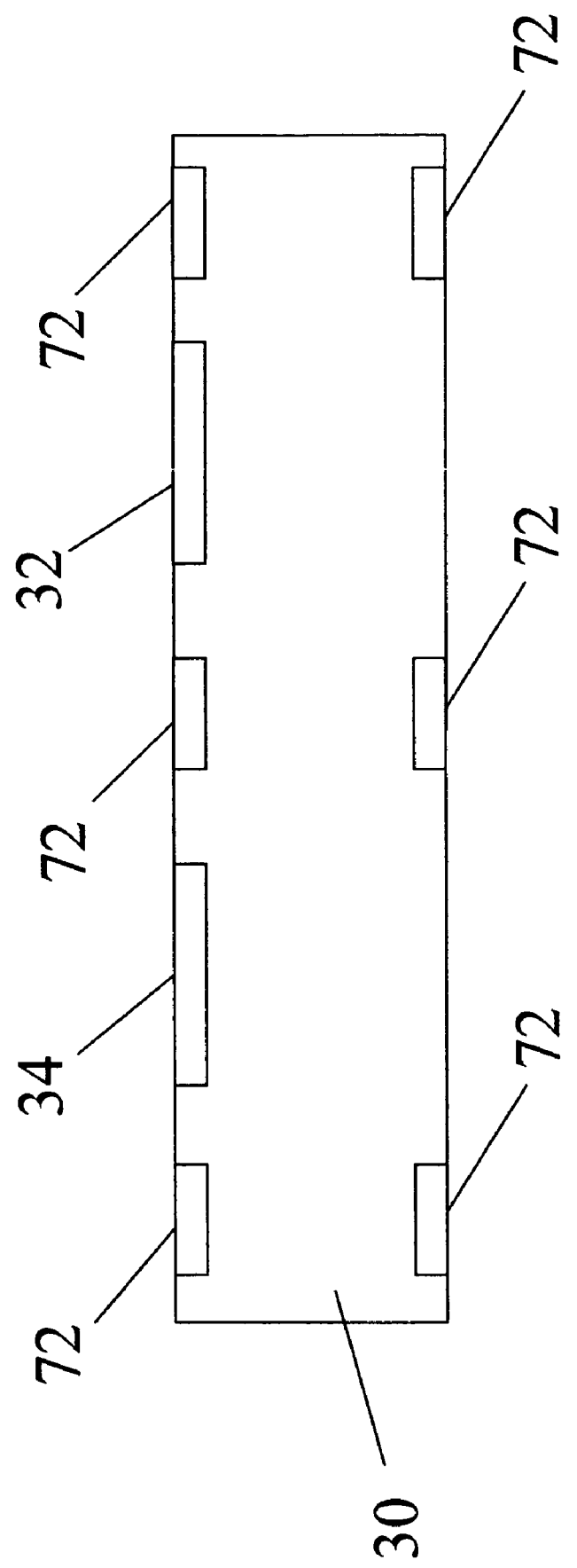
FIG. 7 is an end-view of an individual die, showing the electrical bonding pads and the mechanical bonding pads.

FIG. 6 shows a schematic for the preferred attachment method between die 30 and circuit wafer 22. An array of eutectic solder bumps 70 is attached to the circuit wafer. These eutectics are well known in the bonding industries, and the skilled reader will understand that a variety of glues, adhesives, and other materials could be substituted and the bond can be made anodically or by another means. Solder bumps 60 are also attached to the circuit wafer, and they are in turn electrically connected to traces 36 and 40 by direct contact. FIG. 7 shows and end-view of die 30 which depicts the exposed contact bond pads 32 and 34 of die 30, as well as exposed mechanical bond pads 72 of die 30. Note that mechanical bond pads 72 are located on both sides of die 30, and there are corresponding eutectic solder bumps 70 for each mechanical bond pad 72.

By placing the eutectic solder bumps 70 on both sides of the die, the assembled part of die 30 and circuit wafer 22 is made relatively insensitive to changes in stress at the contact area. The changes in stress could be from a variety of material or environmental factors, such as temperature, stress-relief or aging with the passing of time, etc. With a bond on one side of die 30 only, such changes could result in a change in the angle of die 30 with respect to circuit wafer 22, or a translation between the two pieces. In the current invention, with solder bumps on both sides, there can be changes in stress with very little change in the angles, and virtually no translation.

In the assembly process, die 30 is pressed against the circuit wafer and heat is applied and then removed. At that time, an electrical connection is made between bond pads 32 and 34 and solder bumps 60, respectively. Also, a mechanical connection is made between solder bumps 70 and mechanical bond pads 72 which are located on die 30. In this way, the die is held fast and the electrical connection is made to the die.

In the preferred embodiment, solder bumps 70 are applied to the circuit wafer in discrete shapes instead of a continuous film. This allows the eutectic to flow onto the die or row directly instead of flowing to an adjacent die, aided by the surface tension of the eutectic.

Figure 8:
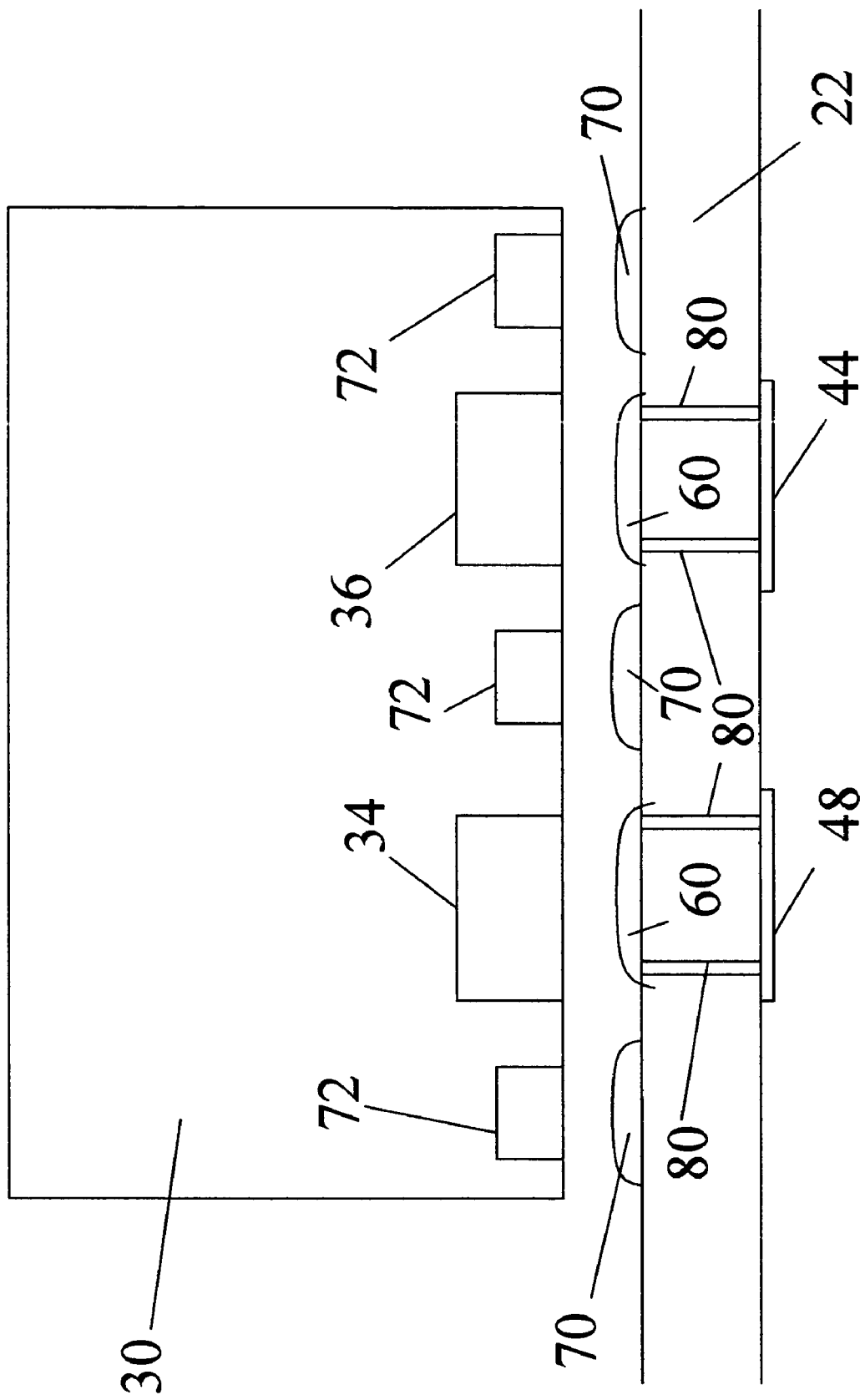
FIG. 8 shows an alternative method, in which holes are formed in the circuit substrate and plated with a conducting film.

FIG. 8 shows another embodiment in which holes are formed in circuit wafer (many methods are well known in the art) and electrically conductive material is attached to the inside of the holes, shown in the diagram as conductive plated films 80. In this case, the electrical connection is made between bond pads 32 and 34 and bond pads 44 and 48, but 44 and 48 exist on the other side of the circuit wafer. This allows a number of benefits, including separation of the circuitry of circuit wafer from the packing of dies.

An additional embodiment is one in which the electrical connections made between bond pads 32 and 34 and the circuit elements on circuit substrate 22 are made by using ball bonding, a technique well known and long practiced in the electronics industry.

Figure 9:
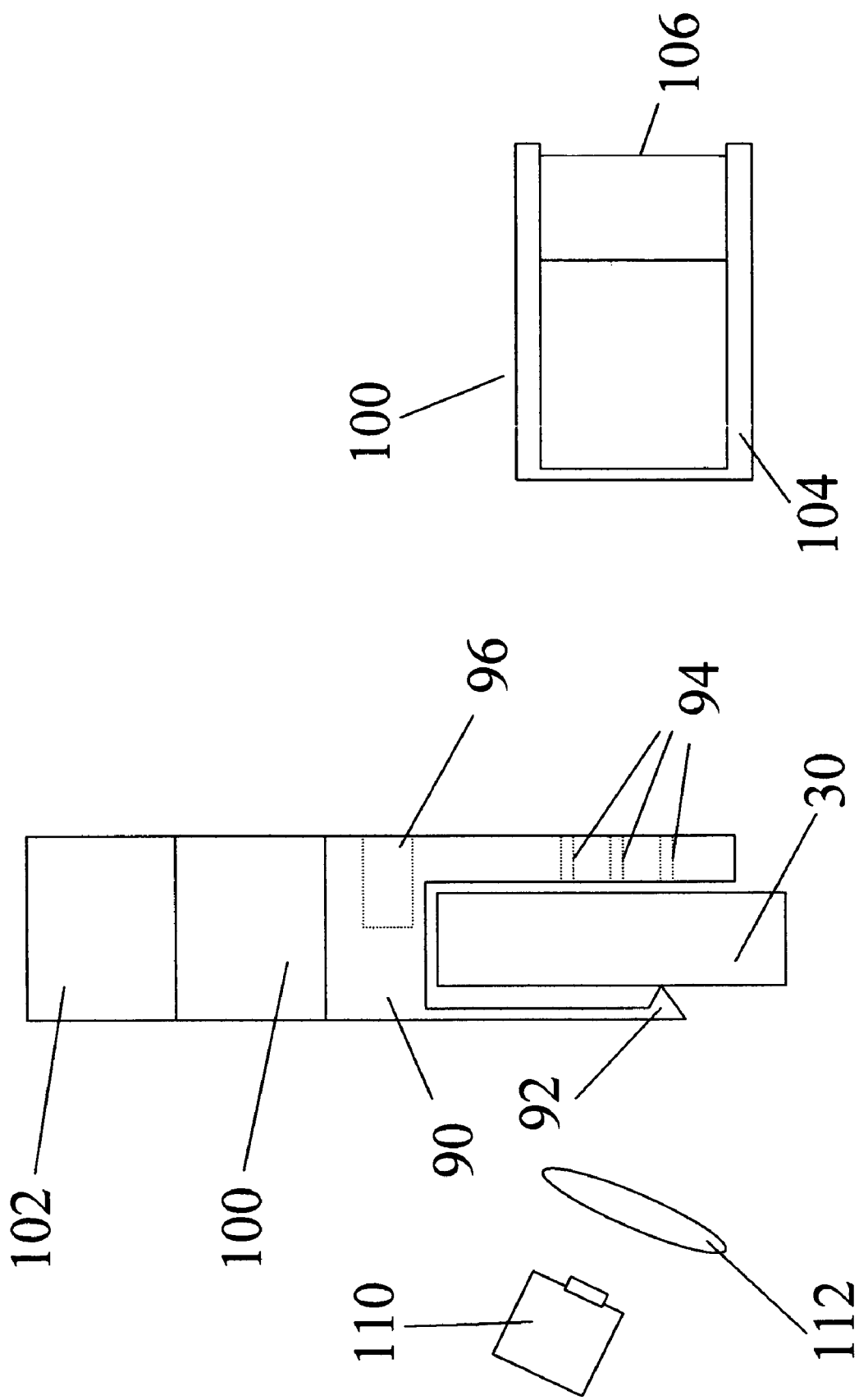
FIG. 9a is a simplified diagram of the tooling fixture for array assembly.
FIG. 9b shows the elevation mechanism of the tooling assembly.

Precision placement of the die onto the circuit wafer is accomplished by an articulated tooling fixture equipped with a feedback device. FIG. 9a shows a simplified diagram of the tooling fixture. Die 30 is held in die holder 90 by vacuum holes 94 and pressure between tensioner 92 and die holder 90. Two-dimensional actuation of die 30 is performed by elevation actuator 100 and azimuth actuator 102. These actuators provide the necessary range for alignment of die 30 with respect to circuit substrate 22. A schematic of elevation actuator 100 is shown in FIG. 9b. Elevation actuator 100 is comprised of actuator body 104 and piezoelectric 106. Piezoelectric 106 would typically be made of a ceramic piezoelectric material, capable of moving several microns with application of hundreds of volts. Actuator body 104 flexes with the expansion or contraction of piezoelectric 106, giving rise to rotation. This method of rotation is well known in the art. It will be understood by the reader that azimuth actuator 102 is a similar mechanism to elevation actuator 100, but rotated 90 degrees.

Light source 110 emits light which passes through line focus lens 112, whose function is to generate a line focus of light along the intersection of die 30 and the circuit wafer, heating each along their line of contact. This light source will provide heat to activate the adhesive, when the die is properly oriented.

Figure 10:
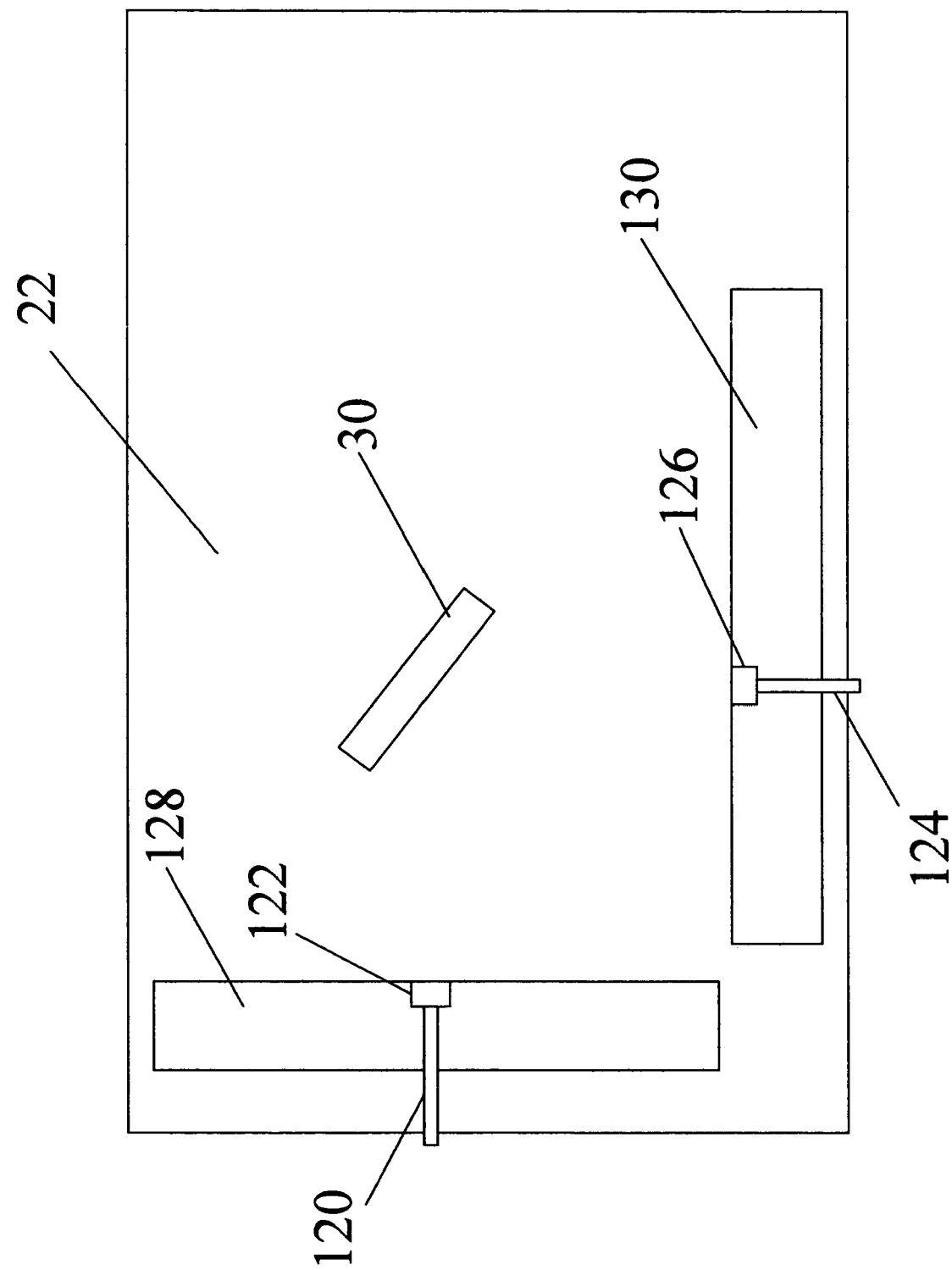
FIG. 10 is a simplified top-down view of the alignment process underway.
Figure 11:
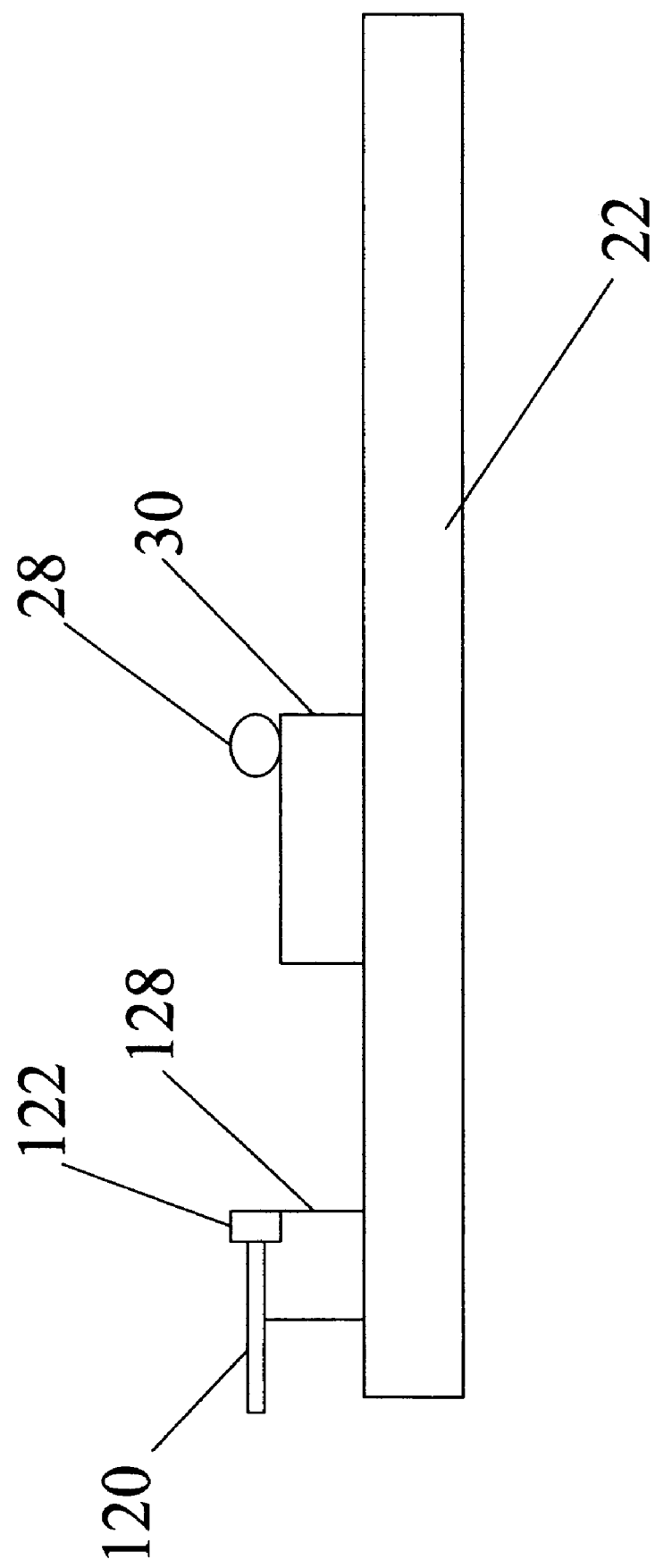
FIG. 11 is a simplified side view of the array assembly with the output fiber block in place.

Orientation of the die holder by the articulated fixture, is under feedback control. The feedback mechanism is shown in FIGS. 10 and 11. A light source 220 is delivered by an optical fiber 120 through a lens 122. Cutout 96 in die holder 90 is a through-hole that allows light from light source 220 to pass through the die holder to the mirror 28 on die 30. The mirror reflects that light toward lens 126 and fiber 124. Measuring the intensity of the light in fiber 124 produces the feedback signal. The die is affixed to the circuit wafer when the light intensity is optimized.

FIG. 10 shows the view from above during alignment. (Die holder 90 and various components from FIG. 9 have been omitted from the drawing for simplicity). Fiber mounting blocks 128 and 130 are mounted to circuit substrate 22. Fibers 120 and 124 and lenses 122 and 126 are mounted to fiber mounting blocks 128 and 120 as shown. FIG. 11 shows the side view, with the output block, fiber and lens not shown for simplicity.

Figure 12:
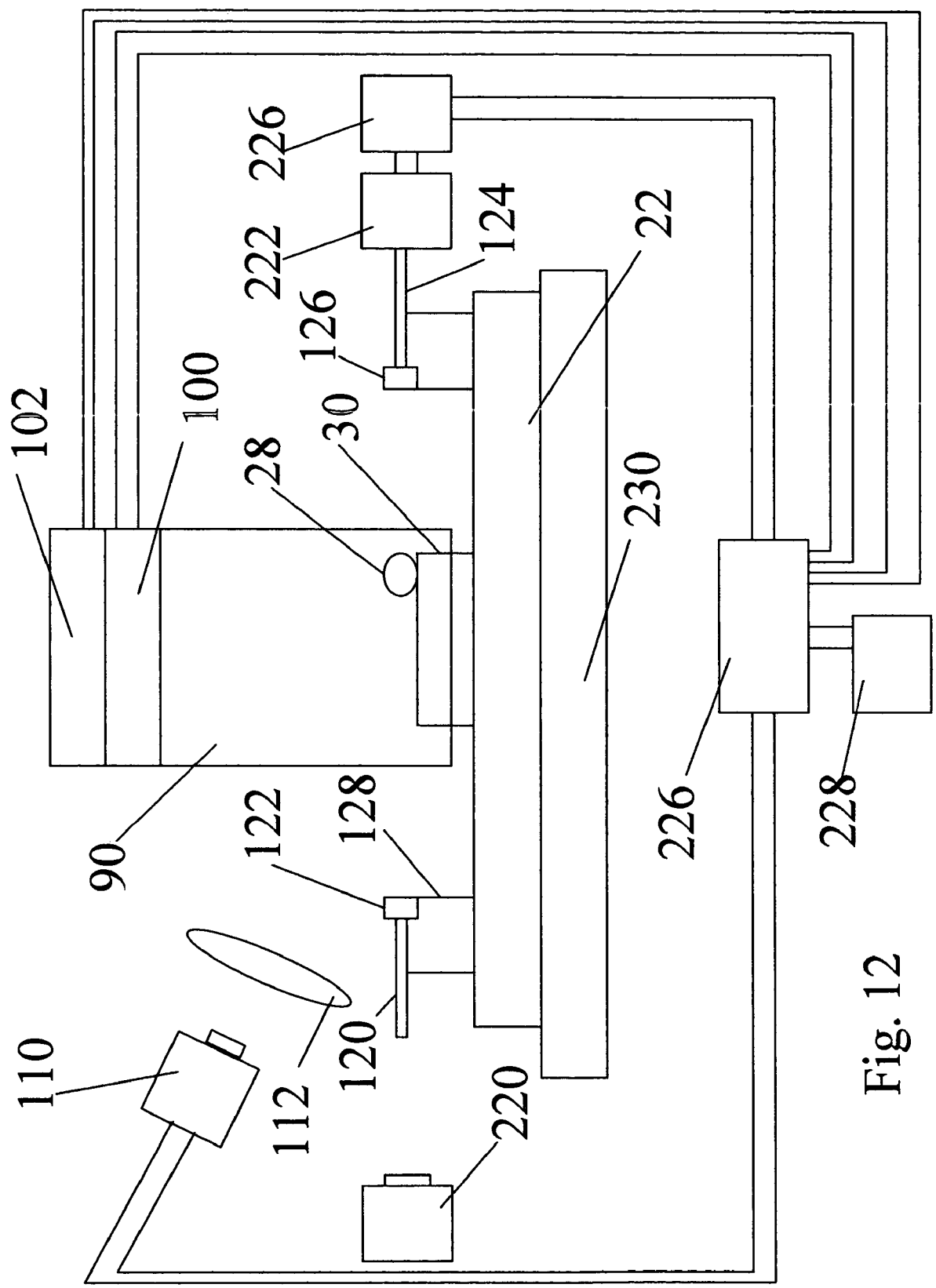
FIG. 12 is a simplified schematic diagram of the feedback apparatus used for aligning the individual die.

The feedback assembly is shown schematically in FIG. 12. The assembly procedure is as follows: (For simplicity, the presence of die holder 90 and various components from FIG. 9 have been omitted from the drawing). XYZ bench 230 is used to properly position circuit wafer 22 with respect to the die by translating in three dimensions. After the die is loaded into the die holder, XYZ bench 230 is activated to bring the circuit wafer into close proximity to the die. Light from light source 220 is applied to input fiber 120 and input lens 122 collimates the light. The resulting beam of light reflects off mirror 28 to output lens 126 that focuses the light onto output fiber 124. (The angular relationship between input fiber 120, mirror 28 and output fiber 124 is as shown in FIG. 10 and their relationship is shown in FIG. 12 is purely schematic.) The light intensity is then detected by light detector 222, amplified by amplifier 224 and the resulting signal is provided to feedback electronics 226.

Under computer 228 control, feedback electronics 226 drives actuators 100 and 102 to optimize the signal intensity of light detector 222. By optimizing the mirror angles in azimuth and elevation, the signal strength is increased. Computer 228 determines the rate of progress of the optimization and at such time that the progress is determined to be sufficient, the feedback electronics halts and locks the signal to actuators 100 and 102 and computer 228 sends a trigger signal to light source 110.

Light emitted from light source 110 is focused by line focus lens 112 onto the area of proximity between die 30 and the circuit wafer, sufficiently heating the region to cause the eutectic 70 to melt, bridging between die 30 and the circuit wafer, aided by surface tension of the eutectic. (See FIG. 7 for the spatial relationship between eutectic 50 and the bond pads of die 30.) After a brief time, computer 228 signals light source 110 to turn off, the eutectic 70 cools and solidifies, and the bonding operation is complete with the die 30 accurately placed with respect to circuit wafer and input and output optical fibers and lenses.

It should be understood that all references to mounting, aligning and bonding dies can also be applied to rows of various lengths which include some number of dies, and that the invention herein covers these cases. In addition, the assembly technique with feedback can be applied to a single die at a time in order to generate a multi-mirror switch array, or can be applied to many dies or rows at a time.

Figure 13:
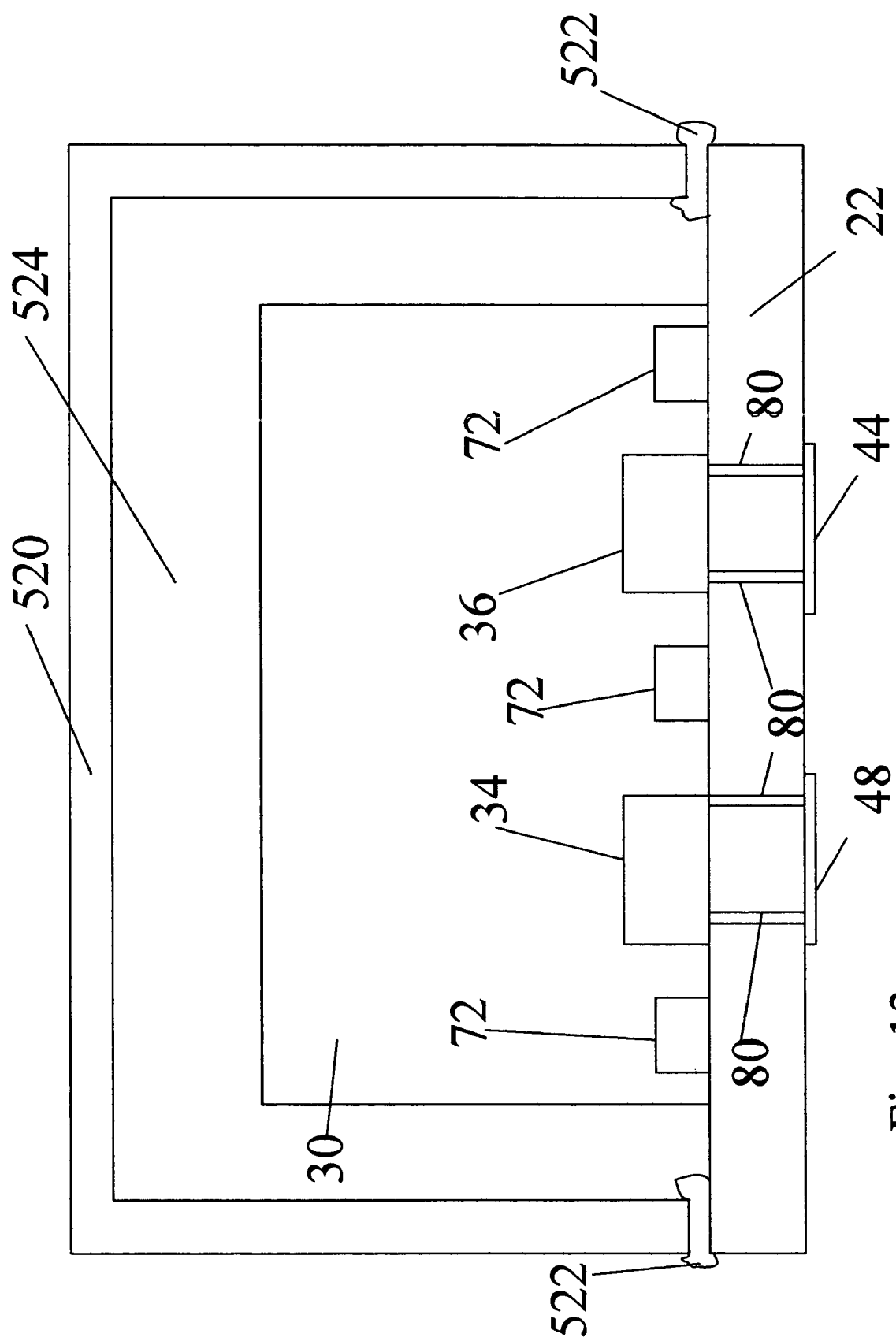
FIG. 13 shows the packaging of the finished array device.

A further embodiment of this invention is the method used in sealing the packaging around circuit wafer and the input and output fibers. The problem to be solved is to hermetically seal the package, allow testing of the hermetic seal, and to optimize the cooling or mechanical damping of interior parts in the finished packaged device. Referring to FIG. 13, lid 520 is applied to circuit wafer with a eutectic seal 522 around all edges. This technique is well known in packaging art. The environmental atmosphere at the time of sealing is controlled to be a specific gas at a specific pressure. To accomplish this, the unsealed package must be placed in a vacuum chamber and the pressure reduced to allow sufficient out gassing of the materials. Then the environment is filled with the proper gas at the proper pressure, and the two pieces of the package, the circuit wafer and lid are pressed together, with a combination of pressure and temperature, as required by the eutectic. Gas 524 is thereby hermetically sealed inside the package between circuit substrate 22 and lid 520.

To check the eutectic seal, the chamber is again pumped to a high vacuum and leak checking is performed with a residual gas analyzer, well known in the art of vacuum engineering.

The specific gas and specific pressure chosen for the package depends on the requirements for the device. For optimum cooling, helium gas is chosen with the pressure such that the mean free path of the helium molecules in the device is approximately the dimension of a characteristic length of the device, i.e. the height of the inside of the package. For mechanical damping, the gas chosen could be xenon and the pressure is adjusted for the proper damping, potentially greater than 1 atmosphere.

While the invention has been particularly described and illustrated with reference to a preferred embodiment, it will be understood by those skilled in the art that changes in the description and illustrations may be made with respect to form and detail without departing from the spirit and scope of the invention. Accordingly, the present invention is to be considered as encompassing all modifications and variations coming within the scope defined by the following claims.

What is claimed is:

1. An array of lithographically fabricated MEMS devices comprising:
   a plurality of individual dies including at least one MEMS device, each die having been separated from adjacent dies on an original fabrication wafer, with each die of the plurality positioned on a second wafer, and affixed mechanically to said second wafer.

2. The array of lithographically fabricated MEMS devices according to claim 1, wherein each individual die in the array is connected electrically to supporting circuiting in said second wafer.

3. The array of lithographically fabricated MEMS devices according to claim 1, wherein said second wafer comprises electronic circuitry to manipulate said at least one MEMS devices.

4. The array of lithographically fabricated MEMS devices according to claim 1, wherein each individual die has been rotated out of an original plane of fabrication.

5. The array of lithographically fabricated MEMS devices according to claim 1, wherein the dies in the array are not all alike.

6. The array of lithographically fabricated MEMS devices according to claim 1, wherein the at least one MEMS device comprises a utilitarian feature affixed to a MEMS microactuator.

7. The array of lithographically fabricated MEMS devices according to claim 1, wherein the at least one MEMS device comprises a fluid flow diverter affixed to a MEMS microactuator.

8. The array of lithographically fabricated MEMS devices according to claim 1, wherein the at least one MEMS device comprises an electrical relay affixed to a MEMS microactuator.

9. The array of lithographically fabricated MEMS devices according to claim 6, wherein the utilitarian feature of at least one of the MEMS devices differs from the utilitarian feature of at least one other of the MEMS devices.

10. The array of lithographically fabricated MEMS devices according to claim 6, wherein the utilitarian feature is the same for each of the at least one MEMS device.

11. The array of lithographically fabricated MEMS devices according to claim 1, wherein the at least one MEMS device comprises an optical element affixed to a MEMS microactuator.

12. The array of lithographically fabricated MEMS devices according to claim 11, wherein said optical element comprises a mirror.

13. The array of lithographically fabricated MEMS devices according to claim 12, wherein the array is coupled with a block of N input optical fibers and a block of M exit optical fibers, forming an N×M fiber optic switch.

14. The array of lithographically fabricated MEMS devices of claim 1, wherein the plurality of individual dies are detached from adjacent dies on the original fabrication wafer, before being affixed to the second wafer.

15. The array of lithographically fabricated MEMS devices according to claim 1, wherein each individual die has been rotated out of an original plane of fabrication into a rotated orientation, and affixed in the rotated orientation to the second wafer.

16. The array of lithographically fabricated MEMS devices of claim 1, wherein the plurality of individual dies includes at least one unencapsulated MEMS device.

* * * * *